United States Patent [19]
Platzoeder et al.

[11] Patent Number: 4,992,851
[45] Date of Patent: Feb. 12, 1991

[54] CHARACTERISTIC IMPEDANCE-CORRECT CHIP CARRIER FOR MICROWAVE SEMICONDUCTOR COMPONENTS

[75] Inventors: Karl Platzoeder, Haimhausen; Walter Zimmermann, Oberdorfen, both of Fed. Rep. of Germany

[73] Assignee: Siemens Aktiengesellschaft, Berlin and Munich, Fed. Rep. of Germany

[21] Appl. No.: 163,198

[22] Filed: Feb. 26, 1988

Related U.S. Application Data

[63] Continuation of Ser. No. 766,193, Sep. 16, 1985, abandoned.

[30] Foreign Application Priority Data

Nov. 2, 1984 [DE] Fed. Rep. of Germany ....... 3440171

[51] Int. Cl.$^5$ ...................... H01L 23/12; H01L 23/48
[52] U.S. Cl. ........................................ 357/74; 357/80; 357/81
[58] Field of Search ........................ 357/81, 80, 74, 72

[56] References Cited

U.S. PATENT DOCUMENTS

| | | | |
|---|---|---|---|
| 3,651,434 | 3/1972 | McGeough et al. | 338/84 M |
| 3,769,560 | 10/1973 | Miyake et al. | 317/234 R |
| 3,864,727 | 2/1975 | Schoberl | 357/65 |
| 3,946,428 | 3/1976 | Anazawa et al. | 357/74 |
| 4,115,837 | 9/1978 | Beall et al. | 357/81 |
| 4,340,902 | 7/1982 | Honda et al. | 357/81 |
| 4,509,096 | 4/1985 | Baldwin et al. | 357/80 |

Primary Examiner—Rolf Hille
Assistant Examiner—S. V. Clark
Attorney, Agent, or Firm—Jeffrey P. Morris; James G. Morrow

[57] ABSTRACT

In a chip carrier for microwave components with an electrically conductive support and with a dielectric substrate, the electrical leads should be able to be impedance-matched in a simple manner. Such a chip carrier should be easy to insert in a microwave circuit and should have a simple construction. A recess (3) in the dielectric substrate (1) is in shape and size to the microwave component(s) to be mounted. The dielectric substrate (1) rests on the electrically conductive support (2). At least one microwave semiconductor component (4) is inserted in the recess (3) of the dielectric substrate (1). The ground terminals (11) of the microwave semiconductor component (4) are connected with the support (2) inside the recess (3). In the connection surface between the dielectric substrate (1) and support (2), the substrate (1) protrudes beyond the support (2). Where the substrate (1) protrudes beyond the support (2), the microwave strip lines (5) applied on the upper surface of the substrate (1) have thickened sections (6) for electrical connection to other materials.

11 Claims, 2 Drawing Sheets

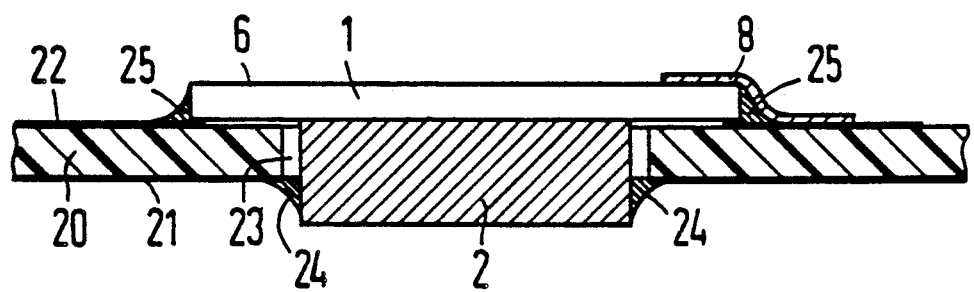
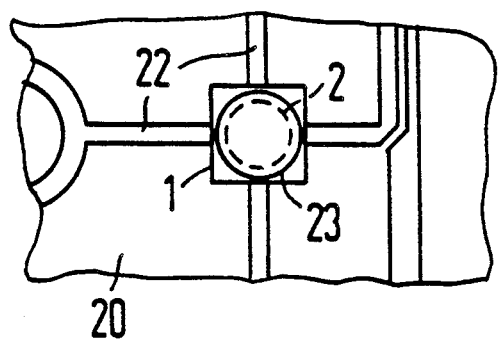
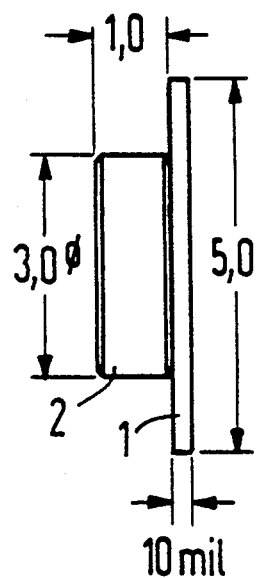

CHARACTERISTIC IMPEDANCE-CORRECT CHIP CARRIER FOR MICROWAVE SEMICONDUCTOR COMPONENTS

CROSS-REFERENCE TO RELATED APPLICATION

This is a continuation of Ser. No. 776,193 filed Sept. 16, 1985, abandoned 4-11-88.

BACKGROUND OF THE INVENTION

The invention relates to a chip carrier for microwave semiconductor components.

For microwave semiconductor components, for example integrated gallium-arsenide microwave circuit chips, it is necessary to provide characteristic impedance-correct package assemblies. In the encapsulation of microwave semiconductor chips in a housing or in the seating of microwave semiconductor chips on a chip carrier, such package assemblies should exhibit optimum microwave properties, good heat dissipation, full testability and easy installability by the customer.

If a semiconductor chip is mounted directly in a circuit without the use of a chip carrier, this semiconductor chip can be tested only to a limited extent before it is mounted. This results in a relatively high failure rate for such a semiconductor chip.

The U.S. Pat. No. 4,115,837 discloses a chip carrier for an integrated circuit wherein the integrated circuit is placed on a substrate of insulating material. To be able to accommodate a maximum number of electrical connections with the integrated circuit, the insulating substrate extends outward beyond a support in that area in which it is to be secured on the support. For microwave applications such a support is not provided. For testing purposes, a metallization is applied on the outer edge of the underside of the insulating substrate. This less than full-area metallization interferes with the transmission of microwaves. In order to be able to carry out a test, this chip carrier has an electrical connection of complicated design between the chip and this metallization on the underside of the insulating substrate. Except for testing purposes, the grounding lead of the chip does not extend through the underside of the insulating substrate.

The U.S. Pat. No. 4,340,902 discloses a chip carrier in which the chip is placed on a metal element for better heat removal. Via a complicated grounding lead, which traverses a multi-layer ceramic structure, the chip is connected with a metallic plate that is disposed between the foundation of the chip and the support. The construction of this chip carrier is complicated and not adaptable in a versatile manner to all types of microwave components on all types of boards.

The U.S. Pat. No. 3,864,727 discloses a chip carrier in which the chip is placed on an insulating substrate. This insulating substrate, in turn, is applied on a metallic support which, in the area on which the substrate is applied, extends substantially beyond the substrate. Such a chip carrier has wide strip lines, cannot be placed on circuit boards, and is not suitable in its construction for microwave circuits.

The U.S. Pat. No. 3,946,428 discloses a chip carrier in which, in a recess of a dielectric substrate, the chip is placed on a metallic intermediate element which, in turn, is placed on the metallic support. Here the metallic support has the same external dimensions as the dielectric substrate. A characteristic impedance matching is effected through the provision of additional dielectric elements. This complicates the construction, which permits only a small number of strip lines.

The U.S. Pat. No. 3,769,560 discloses a chip carrier which has a complicated design and requires special electrical connections for electrical grounding lines. Such a chip carrier is not particularly suitable for microwave applications.

The U.S. Pat. No. 3,590,341 discloses a chip carrier which, for the installation of a transistor, requires, for reasons of symmetry, two electrical leads to the emitter of the transistor. These separate leads to the emitter need considerable space not only on the chip carrier, but also on the circuit board on which the chip carrier is to be placed. Furthermore, these leads are expensive due to the material they require. This particular chip carrier also exhibits poor heat dissipation.

The U.S. Pat. No. 3,651,434 discloses a chip carrier in which a dielectric substrate is placed on a support. Inside a recess in the dielectric substrate, a microwave component is placed on the support. Between the dielectric substrate and the support at least one area is provided in which the support is coated with a metallization. This metallization extends from the area in which the dielectric substrate rests on the support, far beyond the dimensions of the dielectric substrate. The dielectric substrate is relatively thick. Therefore the electric connections must be relatively thick over their entire length, thereby permitting only a low packing density of electrical leads. Not only is the construction of such a chip carrier complicated, but it also is not particularly favorable for microwave applications. In particular it is not possible, or at least not in a simple manner, to adapt such a chip carrier with its electrical connections to various purposes of use; that is, to various user circuits.

SUMMARY OF THE INVENTION

It is the object of the present invention to provide a chip carrier of the type described above whose electrical leads can be impedance-matched in a simple manner; which can have optimum microwave properties; which exhibits good heat dissipation; which is easily testable in a simple manner when carrying a semiconductor; which is easy to install at the customer site; which is simple in design; and which, in principle, permits a high packing density of electric microwave leads.

This object, as well as other objects which will become apparent from the discussion that follows, are achieved, according to the present invention, by providing a chip carrier with the following elements:

(a) A support is provided for the microwave integrated circuit ("chip"). The chip support is either made of metal or is metallized to provide a single region which is electrically conductive.

(b) A dielectric substrate is arranged on the chip support. The substrate has an opening therethrough of a prescribed shape and size which is disposed over the aforementioned electrically conductive region of the support. The substrate is dimensioned so as to have portions which protrude outwardly away from the electrically conductive region.

(c) At least one microwave chip is disposed on the support within the opening of the dielectric substrate. This chip is electrically connected to the electrically conductive region of the support, thereby forming a ground.

(d) A number of microwave strip lines are disposed on the upper surface of the dielectric substrate and electrically connected to the microwave chip. The strip lines extend outwardly on the substrate over the protruding portions thereof for connections to other microwave circuits. The strip lines are thicker in the sections thereof which lie over these protruding portions than in the sections which lie over the electrically conductive region, so as to facilitate the electrical connection of other materials which will later be applied to the chip carrier.

The dielectric substrate is advantageously a ceramic disk.

Since, in the area in which the dielectric substrate is placed on the support, the dielectric substrate protrudes over this support, the microstrip lines of the chip carrier can easily be widened where the dielectric substrate protrudes over the support. This makes it possible to achieve a characteristic impedance-correct matching to the material on which the chip carrier is to be placed.

If a connecting ribbon is used for at least one electrical connection of the chip carrier, there will be practically no butt edge when the chip carrier is placed, for example, on a master board. Reflection of energy is thereby avoided. The same is true of a chip carrier according to the invention in the case where at least one connecting edge is metallized.

In a chip carrier according to the invention, the support may be made either entirely of metal or it may be metallized. Such metallization need not extend over the total surface of the support. The important thing is that the metallization not be located, to any substantial extent, in the vicinity of those sites where the microstrips are widened and/or thickened. The metallization of the support preferably assumes a dimension such that the grounding leads of the semiconductor can be electrically connected with the ground of a user circuit through this metallization. At the same time this metallization is utilized to remove heat. Depending on how much heat is generated in the semiconductor chip, the metallization or, respectively, the metallic property of the support can be used to dissipate this heat.

A chip carrier according to the invention makes possible a short grounding lead and therefore a low inductance of the grounding terminal.

For a full understanding of the present invention, reference should now be made to the following detailed description of the preferred embodiments of the invention and to the accompanying drawings.

BRIEF DESCRIPTION OF THE DRAWINGS

FIG. 3 is a cross-sectional view of a chip carrier according to the invention installed in a microstrip line microwave circuit.

FIG. 4 is a plan view of a chip carrier according to the invention installed in a microstrip line microwave circuit.

FIG. 5 is a side view showing preferred dimensions of the dielectric substrate and chip support forming the chip carrier according to the invention.

DESCRIPTION OF THE PREFERRED EMBODIMENTS

Figure 1:
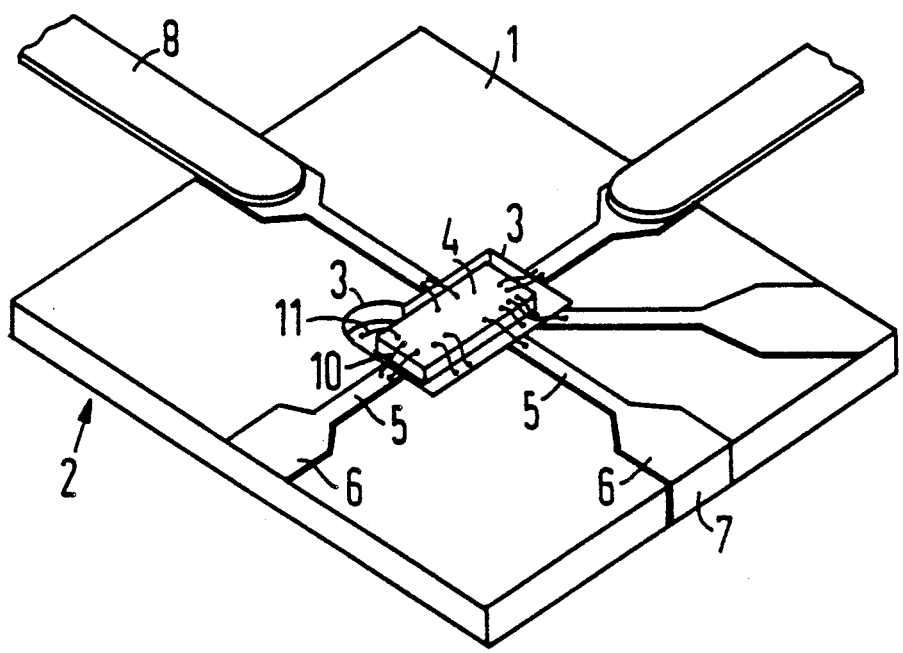
FIG. 1 is a perspective view of a chip carrier according to the invention.
Figure 2:
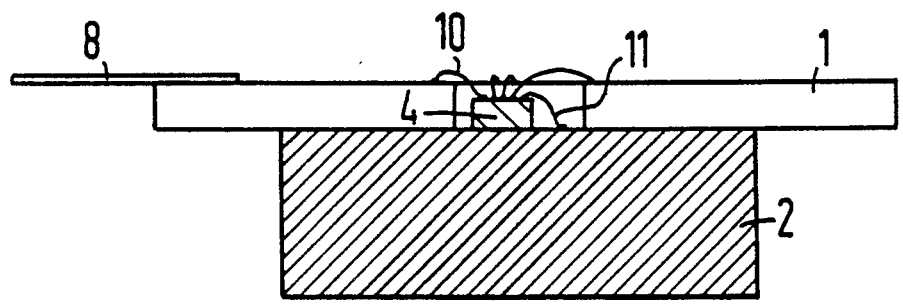
FIG. 2 is a cross-sectional view of the chip carrier shown in FIG. 1.

FIG. 1 and 2 show a chip carrier according to the invention. A dielectric disk-shaped substrate 1, provided with microstrip connecting lines 5 and with a variably shaped opening or recess 3, is connected with a conductive support 2 in such a way that the support 2 is accessible through the recess 3. The support 2 is preferably designed as a cylindrical metal stud. A semiconductor chip 4, with its ground lead 11, is arranged on the support 2 in the recess 3. The other leads 10 of the semiconductor chip 4 extend to the microstrip lines 5 on the dielectric substrate 1.

In those areas in which the dielectric substrate 1 is disposed on the support 2, the dimensions of the support 2 lie within the dimensions of the dielectric substrate 1. The microstrip lines 6, which begin and protrude past the outer border of the area of contact between the dielectric substrate 1 is disposed on the support 2, are widened in such a way as to effect a characteristic impedance-correct matching to the material of the master board 20 (see FIGS. 3 and 4) on which the chip carrier is placed. The master board 20 may consist of Teflon RT Duroid 5880, 0.38 mm, for example, or it may be made of a ceramic material. The connecting edges 7 of the chip carrier may be metallized or the chip carrier may be provided with connecting ribbons 8. With the use of connecting ribbons 8, or by metallization of the connecting edges, it is possible to avoid butt edges.

It is possible to provide a covering or even a hermetic encapsulation of the semiconductor 4 by methods well known in the art.

FIGS. 3 and 4 show a chip carrier after it has been mounted in a microstrip line circuit. This mounting is effected by placing the chip carrier on a master board 20. For the mounting, the support 2 (metal stud) of the chip carrier is inserted in a recess 23 of the microstrip line circuit 20 and electrically connected with the ground 24 on the back The other connections 25 of the chip carrier occur on the top side of the master board 20.

Butt joints between microstrip lines of the chip carrier and microstrip lines of the master board can be minimized if it is desirable in terms of circuitry. For this purpose the electrical connections 24, 25 can be established by gluing or soldering. In this way when using either a downward metallization 7 on the chip carrier or when using a connecting ribbon 8, electrical connections are established between the chip carrier and the microwave stripline circuit on the master board which show practically no butt edge. A reflection of energy is thereby avoided.

On the back of the master board 20, an electrical connection is established between a metallized area of the support 2 and the rear foil or lamination 21 of the master board 20. On the top side of the master board 20 electrical connections are established between the terminals of the chip carrier and the individual microstrip lines 22.

When using a connecting ribbon 8 on the chip carrier, metallic adhesive or solder may be applied between the respective part of the edge of the chip carrier and a microstrip line 22 on the master board 20 in such a way that the connecting ribbon 8 is connected in a simple manner both with the metallic adhesive or metallic solder as well with the microstrip line 22 on the master board 20, by bending.

FIG. 4 is a plan view of the master board (microstrip-line circuit) 20 on which the chip carrier is placed. The support 2 of the chip carrier fits exactly into the recess 23 of the master board 20. The recess 23 is located on the master board 20 so that the microstrip lines 6 of the chip carrier can be connected with the microstrip conductors 22 of the master board 20 in a simple manner.

FIG. 5 shows preferred dimensions and materials for the chip carrier. The dielectric substrate 1 of the chip carrier consists preferably of aluminum oxide ($Al_2O_3$) and is preferably 10 mil thick. The dielectric substrate 1 may have, for example, a diameter or a linear dimension in each of the two directions normal to the chip carrier axis equal to 5.0 mm. The support 2 of the chip carrier is preferably a cylindrical metal stud. The support 2 preferably has a diameter of 3.0 mm and a height of 1.0 mm.

The use of a metallic support 2 has the advantage that, with a component 4 mounted directly on the metal support 2, the heat dissipation is optimized and a ground connection is produced which has very low ohmic resistance. On the other hand, the use of a metallized support 2 has advantages with respect to the matching of the coefficients of thermal expansion of the abutting materials.

By adapting the form and size of the recesses 3 to the requirements of various components, the connecting lines between the chip components on the one hand and the microstrip lines or, respectively, the metallic or metallized support 2 on the other hand can be kept as short as possible.

Since the dielectric substrate 1 lies directly on the support 2, the dielectric substrate can be kept very thin. The advantage of this is that, even at frequencies of up to 30 GHz, the microstrip lines need have only a small thickness so that, for a given number of microstrip lines, the recess 3 can be made correspondingly small. This in turn results in short connecting lines between the chip contacts and the microstrip lines or the support 2, respectively, leading to a reduction of the total impedance.

The chip carrier according to the invention is particularly suitable for microwave integrated circuits. Since the chip contacts, microstrip lines and also the metallic or metallized supports 2 are accessible prior to encapsulation, if encapsulation is applied, microwave components already installed in the chip carrier can easily be measured, tested or aligned (trimmed). The chip carrier is versatile, as it can be used for various components, component groups and circuits. Lastly, such a chip support can easily be hermetically sealed by applying a covering cap above the substrate 1.

The recess 3 can be varied as to form and size for the individual needs and requirements of each microwave component to be applied on the chip carrier. When using a metallized support 2, the material of the substrate 1 is selected so that these materials have approximately equal thermal expansion coefficients. For example, for the support 2 the same material can be provided with the same metal coating as is used for the substrate 1.

As mentioned above, the chip carrier can be hermetically sealed by applying a covering. The covering may consist of either a dielectric sealing composition or a dielectric cover (lid).

The microstrip lines can be matched, characteristic impedance-correct, for example, to 50 ohms. The breadth of the microstrip lines may be up to 5 mm, in particular between 0.1 mm and 1 mm. The dielectric substrate 1 has preferably a thickness between 0.1 mm and 0.5 mm, in particular 0.25 mm = 10 mil. The support 2 should preferably be sufficiently thick that the electric connections 24 to a microstrip line circuit 20 can still be easily produced.

Microstrip conductors can be produced on the dielectric substrate 1, for example by vaporization with aluminum and by a subsequent structured etching of the aluminum layer. The aluminum structures thus produced constitute microstrip lines. Microstrip conductors can also be produced using thick film techniques.

Additionally and/or alternatively to the semiconductor chip 4, active or passive microwave components can be placed on the substrate 1, either on the substrate surface itself or on the microstrip lines.

A dielectric substrate 1 may also have several supports 2 or several recesses 3. Also, several chip components 4 may be inserted in one recess 3.

The aforementioned thickening of a microwave strip conductor on the dielectric substrate 1 can be obtained by varying the height and/or width or the microwave strip conductor.

Important for the invention is that the matching of the characteristic impedance of a microwave strip conductor on the dielectric substrate 1, to the terminals of a circuit in which the chip carrier is to be used, is carried out on the dielectric substrate 1 itself outside that region in which metallic material is present below the dielectric substrate 1. A chip carrier thus designed can have an optimally low total impedance.

The characteristic impedance-correct matching of the microstrip lines can be done either by computation or empirically. The required thickening of the microstrip conductors depend, as to their geometry, on the material and shape of the support 2, of the substrate 1, of the board 20, of the different relative dielectric constants, the different transit times of the microwaves, the stray fields, and the different types of microwave lines on the substrate 1 and board 20. There must be no characteristic impedance jump at the transistion of an electrical connection from the chip carrier to the board 20.

The dielectric substrate 1 can, in principle, assume any desired shape: for example, that of a circle, square, rectangle, etc.

The chip carrier described not only has characteristic impedance-matched strip conductors, but is also adaptable in a versatile manner for any desired semiconductor component elements and for any desired materials of microwaveline circuits. A thin substrate 1 makes possible narrow strip lines, whereby a high packing density of electrical lines around the recess 3 can be achieved, this being of importance for integrated circuits and/or for hybrid circuits which can be arranged inside the recess 3. At the same time there is very little coupling between the close adjacent lines on the dielectric substrate 1.

Finally, a spider (lead frame), individually matched in characteristic impedance to the particular board material and to the chip carrier, can be placed (for example, soldered) on the chip carrier. The individual matching of the spider can be achieved through differently formed geometries of the spider fingers.

Since, with a spider, narrow tolerances are not realizable, the intended characteristic impedance matching of the microstrip conductors on the dielectric substrate 1 is of advantage, because such microstrip lines can be produced with narrow tolerances for example by a thick film technique.

The advantages of the described chip carrier reside in its ease of manufacture and ease of use. As the chip support 2 has a relatively small diameter, the recess 23 for the support 2 inside the board 20 can be positioned well.

If the support 2 is made as a hollow stud, it has a lower heat capacity and is therefore easier to solder.

For the described chip carrier spiders can be produced in a simple manner so that only a few models of the chip carrier can be employed universally for very many different uses, namely up to 30 GHz.

Important for the described chip carrier is a dielectric substrate 1 which is as thin as possible. Such a dielectric substrate 1 permits a high packing density of strip lines 5, without a disturbing coupling between these strip lines. As the dielectric substrate 1 protrudes beyond the support 2 in the area in which the strip lines 5 are arranged, the strip lines 5 can be thickened into the strip lines 6 in the region away from the metal belonging to support the 2. The strip conductors 6, thickened in height and/or width, are very stable mechanically and are already so wide that extensions can be added via a spider, or directly to strip conductors of a board without especially stringent requirements for the mechanical tolerances of these extensions. This makes the use of the described chip carrier still simpler and cheaper.

There has thus been shown and described a novel chip carrier for microwave semiconductor components which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

What is claimed is:

1. A chip carrier for microwave components comprising:
    a chip support having a single electrically conductive region;
    a dielectric substrate having upper and lower surfaces and at least one opening of a prescribed shape and size, said dielectric substrate being arranged on said support such that said lower surface rests on said support including the single electrically conductive region with said opening disposed over the single electrically conductive region, said dielectric substrate having larger lateral dimensions than said support, and thereby having portions protruding laterally outward away from said single electrically conductive region, the chip support and dielectric substrate defining an area of contact having an outer border;
    at least one microwave semiconductor component including a ground terminal and arranged on said support within said opening and the ground terminal electrically connected to said single electrically conductive region within said opening; and
    a plurality of microwave strip lines disposed on the upper surface of the dielectric substrate and electrically connected to the component, the strip lines each defining a width transition portion located substantially above the outer border as projected to the upper surface of the dielectric substrate, a narrow portion extending outward from the component to the width transition portion, and a widened portion extending outward from the width transition portion, wherein the strip lines are widened at the width transition portion such that the impedance of the strip lines remain substantially constant along the length of the strip lines;
    the widened portions also functioning to facilitate the electrical connection of other materials which will later be applied to the chip carrier.

2. The chip carrier defined in claim 1, wherein at least one of said strip lines extends outward and continues over the edge of said dielectric substrate.

3. The chip carrier defined in claim 1, further comprising at least one connecting ribbon electrically connected to the section lying over said protruding portions of at least one of said strip lines.

4. The chip carrier defined in claim 1, wherein said at least one microwave semiconductor component is covered.

5. The chip carrier defined in claim 4, wherein said at least one microwave semiconductor component is hermetically encapsulated.

6. The chip carrier defined in claim 1, wherein said dielectric substrate is made of a ceramic material.

7. The chip carrier defined in claim 1, wherein said dielectric substrate has a thickness in the range of 0.05 mm to 0.5 mm.

8. The chip carrier defined in claim 1, wherein said chip support is at least partially metallized.

9. The chip carrier defined in claim 1, wherein said dielectric substrate has a relative dielectric constant in the range of 4–12.

10. The chip carrier defined in claim 1, wherein the thickened section of at least one of said strip lines has a width of approximately 5 mm.

11. The chip carrier defined in claim 1, wherein the sections lying over said single electrically conductive region of at least one of said strip lines has a width of less than 1 mm.

* * * * *

UNITED STATES PATENT AND TRADEMARK OFFICE
CERTIFICATE OF CORRECTION

PATENT NO. : 4,992,851
DATED : Feb. 12, 1991
INVENTOR(S) : Platzoeder et al.

It is certified that error appears in the above-identified patent and that said Letters Patent is hereby corrected as shown below:

ON TITLE PAGE:
Section [63] delete "766,193" and insert in its place --776,193--.

Signed and Sealed this

Seventh Day of July, 1992

Attest:

DOUGLAS B. COMER

Attesting Officer

Acting Commissioner of Patents and Trademarks